United States Patent
Jin et al.

(10) Patent No.: US 9,645,372 B2
(45) Date of Patent: May 9, 2017

(54) LIGHT EMITTING DIODES AND OPTICAL ELEMENTS

(71) Applicants: Tsinghua University, Beijing (CN); HON HAI PRECISION INDUSTRY CO., LTD., New Taipei (TW)

(72) Inventors: Yuan-Hao Jin, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 13/728,063

(22) Filed: Dec. 27, 2012

(65) Prior Publication Data
US 2013/0256726 A1 Oct. 3, 2013

(51) Int. Cl.
*H01L 33/00* (2010.01)
*G02B 19/00* (2006.01)
(Continued)

(52) U.S. Cl.
CPC .......... *G02B 19/0061* (2013.01); *H01L 33/20* (2013.01); *H01L 33/58* (2013.01);
(Continued)

(58) Field of Classification Search
CPC ......... H01L 33/22; H01L 33/24; H01L 33/20; H01L 33/44; H01L 33/06; H01L 33/58; H01L 21/0237; H01L 21/0254; H01L 33/007; H01L 33/382; H01L 21/02513; H01L 33/08; H01L 29/0665; H01L 33/405; H01L 33/38; H01L 29/413; H01L 33/0062; H01L 33/36; H01L 2933/0083; G02B 19/0061; Y10S 977/70; Y10S 977/932; B82Y 20/00
USPC ............................... 257/9–39, 79–103, 918, 257/E51.018–E51.022, E33.001–E33.077, 257/E25.028, E25.032, E39, 257/E51.038–E51.04, E23.074, E29.245,
(Continued)

(56) References Cited

U.S. PATENT DOCUMENTS 5,853,960 A 12/1998 Tran et al.
6,495,862 B1 * 12/2002 Okazaki .................. H01L 33/20
257/103

(Continued)

FOREIGN PATENT DOCUMENTS

CN 101999178 3/2011
CN 102097518 6/2011
(Continued)

*Primary Examiner* — Su C Kim
(74) *Attorney, Agent, or Firm* — Steven Reiss

(57) ABSTRACT

An LED comprises a substrate, a first semiconductor layer, an active layer, a second semiconductor layer, a first electrode and a second electrode. The first semiconductor layer, the active layer, and the second semiconductor layer are stacked in that order and located on a surface of the substrate. A number of first three-dimensional nano-structures are located on a surface of the second semiconductor layer away from the active layer. The first three-dimensional nano-structures are linear protruding structures, a cross-section of each linear protruding structure is an arc. The present disclosure also relates to an optical element.

4 Claims, 10 Drawing Sheets

(51) Int. Cl.
*H01L 33/58* (2010.01)
*H01L 33/20* (2010.01)
*B82Y 20/00* (2011.01)
*H01L 33/36* (2010.01)
*H01L 33/22* (2010.01)

(52) U.S. Cl.
CPC .............. *B82Y 20/00* (2013.01); *H01L 33/22* (2013.01); *H01L 33/36* (2013.01); *H01L 2933/0083* (2013.01); *Y10S 977/70* (2013.01); *Y10S 977/932* (2013.01)

(58) Field of Classification Search
USPC .................. 257/E23.165, E29.069–E29.071, 257/E49.001–E49.004, 40, 432, 52, 734, 257/76; 438/22–47, 69, 493, 503, 507, 438/775–777, 956, 962, 71, 98, 478, 701, 438/400, 409, 423, 455, 458, 459, 479, 438/48, 584, 64, 89, 974, 99
See application file for complete search history.

(56) References Cited

U.S. PATENT DOCUMENTS

| | | | |
|---|---|---|---|
| 6,781,160 B1 | 8/2004 | Tsai et al. | |
| 2003/0062530 A1 | 4/2003 | Okazaki et al. | |
| 2003/0178626 A1 | 9/2003 | Sugiyama et al. | |
| 2003/0218179 A1* | 11/2003 | Koide et al. | 257/98 |
| 2007/0018182 A1 | 1/2007 | Beeson et al. | |
| 2007/0194324 A1* | 8/2007 | Kim | H01L 33/22 257/79 |
| 2007/0252164 A1 | 11/2007 | Zhong et al. | |
| 2007/0267640 A1* | 11/2007 | Lee | H01L 33/14 257/94 |
| 2007/0267644 A1* | 11/2007 | Leem | H01L 33/0079 257/98 |
| 2010/0033818 A1* | 2/2010 | Petcavich et al. | 359/507 |
| 2010/0059789 A1 | 3/2010 | Choi | |
| 2010/0060553 A1* | 3/2010 | Zimmerman | H01L 25/0753 345/60 |
| 2010/0264454 A1 | 10/2010 | Yi et al. | |
| 2010/0308359 A1* | 12/2010 | Singh et al. | 257/98 |
| 2011/0088778 A1 | 4/2011 | Lin et al. | |
| 2011/0156088 A1* | 6/2011 | Moon et al. | 257/99 |
| 2011/0186863 A1* | 8/2011 | Lee | H01L 33/005 257/79 |
| 2012/0152353 A1 | 6/2012 | Zhu et al. | |

FOREIGN PATENT DOCUMENTS

| | | |
|---|---|---|
| CN | 102117889 | 7/2011 |
| CN | 102185068 | 9/2011 |
| TW | 575984 | 2/2004 |
| TW | 200501449 | 1/2005 |
| TW | 200945609 | 11/2009 |
| TW | 201006002 | 2/2010 |
| TW | 201031032 | 8/2010 |
| TW | 201119063 | 6/2011 |
| WO | 2012018163 | 2/2012 |

\* cited by examiner

LIGHT EMITTING DIODES AND OPTICAL ELEMENTS

CROSS-REFERENCE TO RELATED APPLICATIONS

This application claims all benefits accruing under 35 U.S.C. §119 from China Patent Application No. 201210089071.4, filed on Mar. 30, 2012 in the China Intellectual Property Office, the disclosure of which is incorporated herein by reference. This application is related to applications entitled, "METHOD FOR MAKING SOLAR CELLS", filed Dec. 27, 2012 Ser. No. 13/727,988, "SOLAR CELLS", filed Dec. 27, 2012 Ser. No. 13/727,999, "WHITE LIGHT EMITTING DIODES", filed Dec. 27, 2012 Ser. No. 13/728,006, "METHOD FOR MAKING LIGHT EMITTING DIODES", filed Dec. 27, 2012 Ser. No. 13/728,018, "LIGHT EMITTING DIODES", filed Dec. 27, 2012 Ser. No. 13/728,031, "LIGHT EMITTING DIODES", filed Dec. 27, 2012 Ser. No. 13/728,035, "METHOD FOR MAKING LIGHT EMITTING DIODES", filed Dec. 27, 2012 Ser. No. 13/728,043, "LIGHT EMITTING DIODES", filed Dec. 27, 2012 Ser. No. 13/728,054, and "METHOD FOR MAKING LIGHT EMITTING DIODES AND OPTICAL ELEMENTS", filed Dec. 27, 2012 Ser. No. 13/728,076.

BACKGROUND

1. Technical Field

The present disclosure relates to a light emitting diode (LED) and an optical element.

2. Discussion of Related Art

LEDs have higher energy conversion efficiency, higher radiance (i.e., they emit a larger quantity of light per unit area), longer lifetime, higher response speed, generate less heat, and have better reliability than conventional light sources. Therefore, LED modules are widely used as light sources in optical imaging systems, such as displays, projectors, and so on.

A conventional LED commonly comprises an N-type semiconductor layer, a P-type semiconductor layer, an active layer, a first electrode, and a second electrode. The active layer is located between the N-type semiconductor layer and the P-type semiconductor layer. The second electrode is located on the P-type semiconductor layer. The first electrode is located on the N-type semiconductor layer. Typically, the second electrode is transparent. In operation, a positive voltage and a negative voltage are applied respectively to the P-type semiconductor layer and the N-type semiconductor layer. Thus, the holes in the P-type semiconductor layer and the electrons in the N-type semiconductor layer can enter the active layer and combine with each other to emit visible light.

However, the efficiency of LEDs is limited by several factors comprising the high refractive index of the P-type semiconductor layer and/or the N-type semiconductor. Therefore, an external quantum efficiency of LEDs is low.

What is needed, therefore, is to provide a light emitting diode and an optical element, which can overcome the above-described shortcomings.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
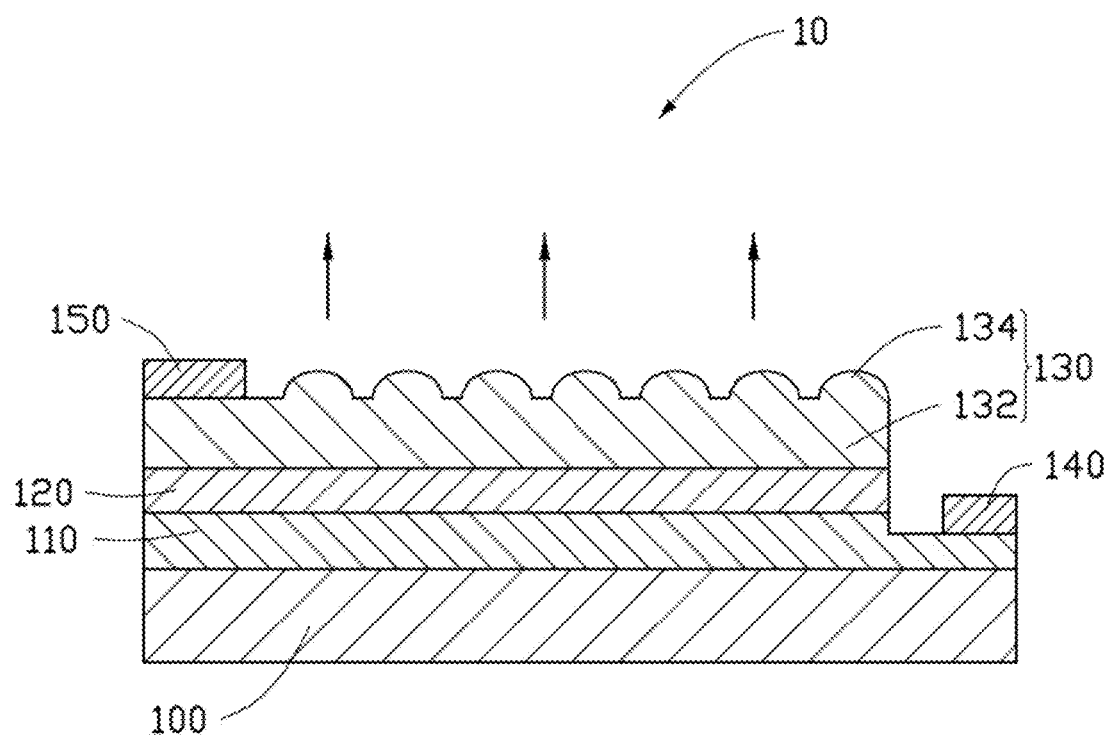
FIG. 1 is a schematic view of one embodiment of a light emitting diode.

Referring to FIG. 1, one embodiment of an LED 10 is provided. The LED 10 comprises a substrate 100, a first semiconductor layer 110, an active layer 120, a second semiconductor layer 130, a first electrode 140, and a second electrode 150. The first semiconductor layer 110 comprises a first surface and a second surface. The substrate 100 contacts the first surface of the first semiconductor layer 110. The active layer 120 and the second semiconductor layer 130 are stacked together and are located on the second surface of the first semiconductor layer 110. The first electrode 140 is electrically connected to the first semiconductor layer 110. The second electrode 150 is electrically connected to the second semiconductor layer 130.

The substrate 100 can be adapted to support the first semiconductor layer 110. A shape or a size of the substrate 100 is determined according to use. The substrate 100 can comprise an epitaxial growth surface which is used to grow the first semiconductor layer 110. The epitaxial growth surface can be a clean and smooth surface. A material of the substrate 100 can be silicon on insulator, $LiGaO_2$, $LiAlO_2$, $Al_2O_3$, Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn or GaP:N. The first semiconductor layer 110 and the substrate 100 should have a small crystal lattice mismatch and a thermal expansion mismatch. A size, thickness, and shape of the substrate 100 can be selected according to use. In one embodiment, the substrate 100 is a sapphire substrate with a thickness of about 400 μm.

The first semiconductor layer 110 can be located on the epitaxial growth surface. The first semiconductor layer 110 can be an N-type semiconductor or a P-type semiconductor.

A material of the N-type semiconductor can comprise N-type gallium nitride, N-type gallium arsenide, or N-type copper phosphate. A material of the P-type semiconductor can comprise P-type gallium nitride, P-type gallium arsenide, or P-type copper phosphate. The N-type semiconductor can be used to provide electrons, and the P-type semiconductor can be configured to provide holes. A thickness of the first semiconductor layer 110 can range from about 1 µm to about 5 µm. In one embodiment, the first semiconductor layer 110 is an N-type gallium nitride. The first surface can be contacted with the substrate 100. The second surface can comprise a first region and a second region based on their function. The first region can be used to locate the active layer 120 and the second semiconductor layer 130. The second region can be used to locate the first electrode 140.

In one embodiment, the LED 10 further comprises a buffer layer (not shown) located on the epitaxial growth surface of substrate 100. Because the first semiconductor layer 110 and the substrate 100 have different lattice constants, the buffer layer can be used to reduce the lattice mismatch. As such, the dislocation density of the first semiconductor layer 110 will decrease. A thickness of the buffer layer can range from about 10 nm to about 300 nm. A material of the buffer layer can be GaN or AlN.

The active layer 120 can be located on the first region of the second surface of the first semiconductor layer 110. In one embodiment, the active layer 120 covers the entire surface of the first region. The active layer 120 can be a photon excitation layer, a single layer quantum well film, or multilayer quantum well films. A material of the active layer 120 can be GaN, GaInN, AlGaInN, GaSn, AlGaSn, GaInP, or GaInSn. A thickness of the active layer 120 can range from 0.01 µm to about 0.6 µm. In one embodiment, the active layer 120 has a thickness of about 0.3 µm and comprises a layer of GaInN and a layer of GaN stacked with the GaInN layer.

The second semiconductor layer 130 can be located on a surface of the active layer 120, away from the first semiconductor layer 110. In one embodiment, the second semiconductor layer 130 covers the entire surface of the active layer 120. A thickness of the second semiconductor layer 130 can range from about 0.1 µm to about 3 µm. The second semiconductor layer 130 can be an N-type semiconductor layer or a P-type semiconductor layer. Furthermore, the type of the second semiconductor layer 130 is different from the type of the first semiconductor layer 110. A surface of the second semiconductor layer 130 away from the active layer 120 can be used as a light emitting surface of the LED 10. In one embodiment, the second semiconductor layer 130 is a P-type gallium nitride doped with Mg and the thickness of the second semiconductor layer 130 is about 0.3 µm.

Figure 2:
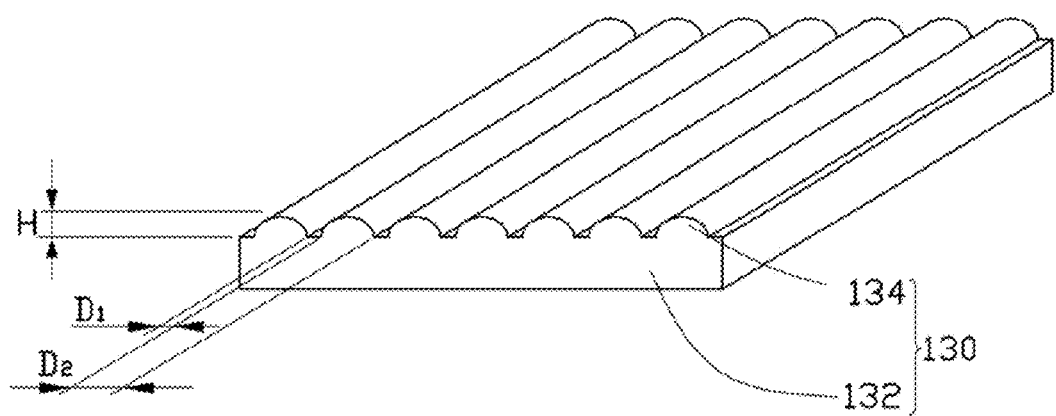
FIG. 2 is a schematic view of a second semiconductor layer of the light emitting diode shown in FIG. 1.
Figure 3:
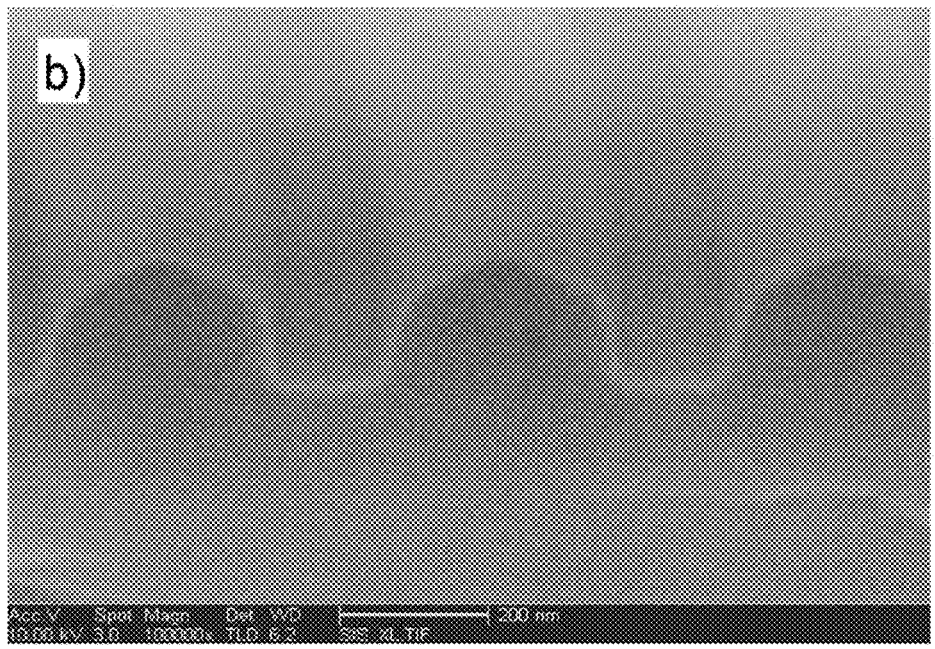
FIG. 3 shows a scanning electron microscope (SEM) image of the second semiconductor layer shown in FIG. 2.

Referring to FIG. 2 and FIG. 3, the second semiconductor layer 130 can comprise a body 132 and a number of the first three-dimensional nano-structures 134. The first three-dimensional nano-structures 134 can be located on a surface of the body 132 away from the active layer 120.

The first three-dimensional nano-structures 134 can be linear protruding structures. The linear protruding structures can protrude out of the surface of the body 132 to form an integrated structure. The linear protruding structures can be uniformly distributed on the surface of the body 132 and spaced from each other. The linear protruding structures can be uniformly distributed on the surface of the body 132 to form an array. The linear protruding structures in the array can be substantially equidistantly arranged, concentric circularly arranged, or concentric rectangle arranged. In one embodiment, the linear protruding structures are substantially equidistantly arranged.

The linear protruding structures can arrange along a straight line, a curvy line, or a polygonal line. The adjacent linear protruding structures can be arranged with a certain distance $D_1$ ranging from about 10 nm to about 1000 nm. In some embodiments, $D_1$ ranges from about 100 nm to about 200 nm. In one embodiment, $D_1$ is about 140 nm. The linear protruding structures can arrange along a same direction. A cross-section of each linear protruding structure along the extending direction can be an arc. A height H of the arc can range from about 100 nm to about 500 nm. In some embodiments, H ranges from about 150 nm to about 200 nm. A width $D_2$ of the arc can range from about 200 nm to about 1000 nm. In some embodiments, $D_2$ ranges from about 300 nm to about 400 nm. In some embodiments, the cross-section of the linear protruding structure along the extending direction is a semicircle. A diameter of the semicircle can range from about 300 nm to about 400. In one embodiment, the diameter of the semicircle is about 320 nm.

The first electrode 140 can be electrically connected to the first semiconductor layer 110 and spaced apart from the active layer 120. The first electrode 140 can cover at least part of the surface of the second region. The first electrode 140 can be a single layer structure or a multi-layer structure. A material of the first electrode 140 can be selected from Ti, Ag, Al, Ni, Au, or a combination thereof. The material of the first electrode 140 can also be indium-tin oxide or carbon nanotube film. In one embodiment, the first electrode 140 is a two-layer structure comprising a Ti layer with a thickness of about 15 nm and an Au layer with a thickness of about 200 nm.

The second electrode 150 can be electrically connected to the second semiconductor layer 130. In one embodiment, the second electrode 150 is located on the light emitting surface of LED 10. The shape of the second electrode 150 is arbitrary and can be selected according to need. The second electrode 150 can cover a part or the entire surface of the second semiconductor layer 130. A material of the second electrode 150 can be Ti, Ag, Al, Ni, Au, or a combination thereof. The material of the second electrode 150 can also be indium-tin oxide or carbon nanotube film. In one embodiment, the first electrode 140 is a two-layer structure a Ti layer with a thickness of about 15 nm and an Au layer with a thickness of about 100 nm.

Furthermore, a reflector layer (not shown) can be located on a surface of substrate 100, away from the active layer 120. A material of the reflector can be titanium, silver, aluminum, nickel, gold or a combination thereof. The reflector comprises a smooth surface having a high reflectivity. The photons that reached the reflector can be reflected by the reflector. Thus, these photons can be extracted out of the LED 10 to improve the light extraction efficiency of the LED 10.

Figure 4:
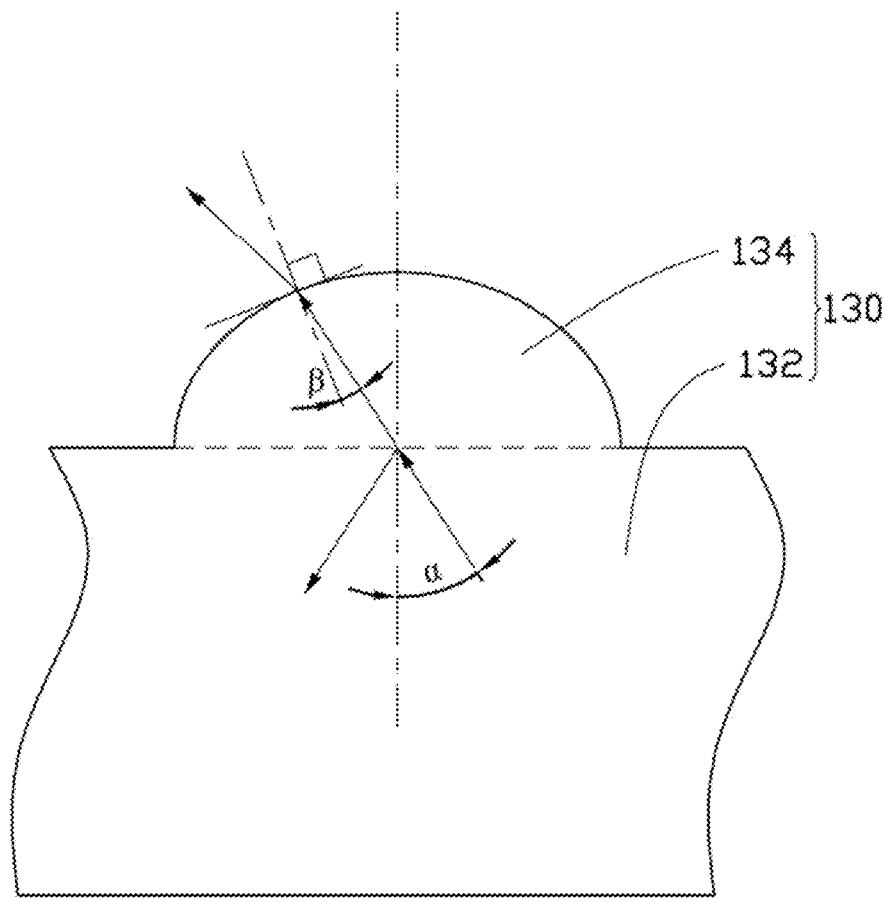
FIG. 4 shows a light extraction schematic view of the second semiconductor layer shown in FIG. 2.
Figure 5:
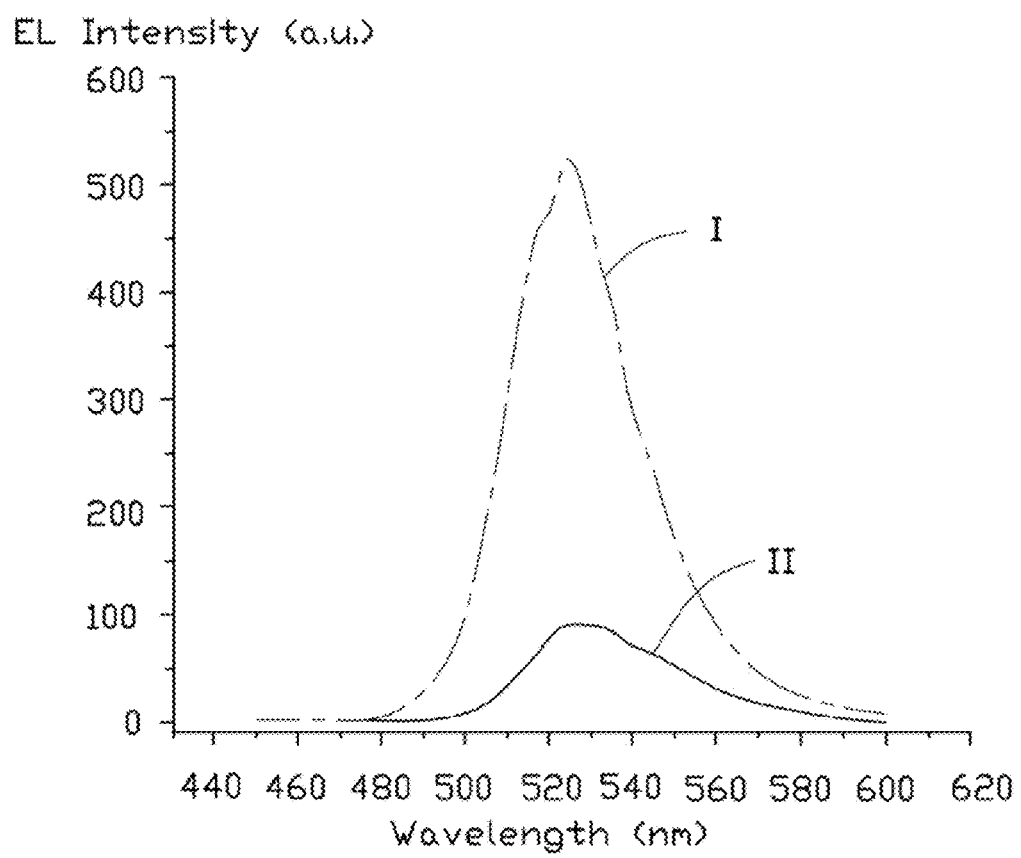
FIG. 5 shows light extraction intensity curves of an embodiment of light emitting diode and a conventional light emitting diode respectively.

Referring to FIG. 4, the LED 10 comprises the first three-dimensional nano-structures 134 located on the light emitting surface. Thus, a light having a large incidence angle α (e.g. larger than 23.58°) emitted from the active layer 120 can be transformed into a light having small incidence angle β by the first three-dimensional nano-structures 134. Therefore, the light having small incidence angle β can emit from the LED 10 and the light extraction efficiency of the LED 10 can be improved. Referring to FIG. 5, the light extraction intensity is enhanced by approximately 4.7 times for the LED 10 (curve I) compared with the standard LED (curve II).

Figure 6:
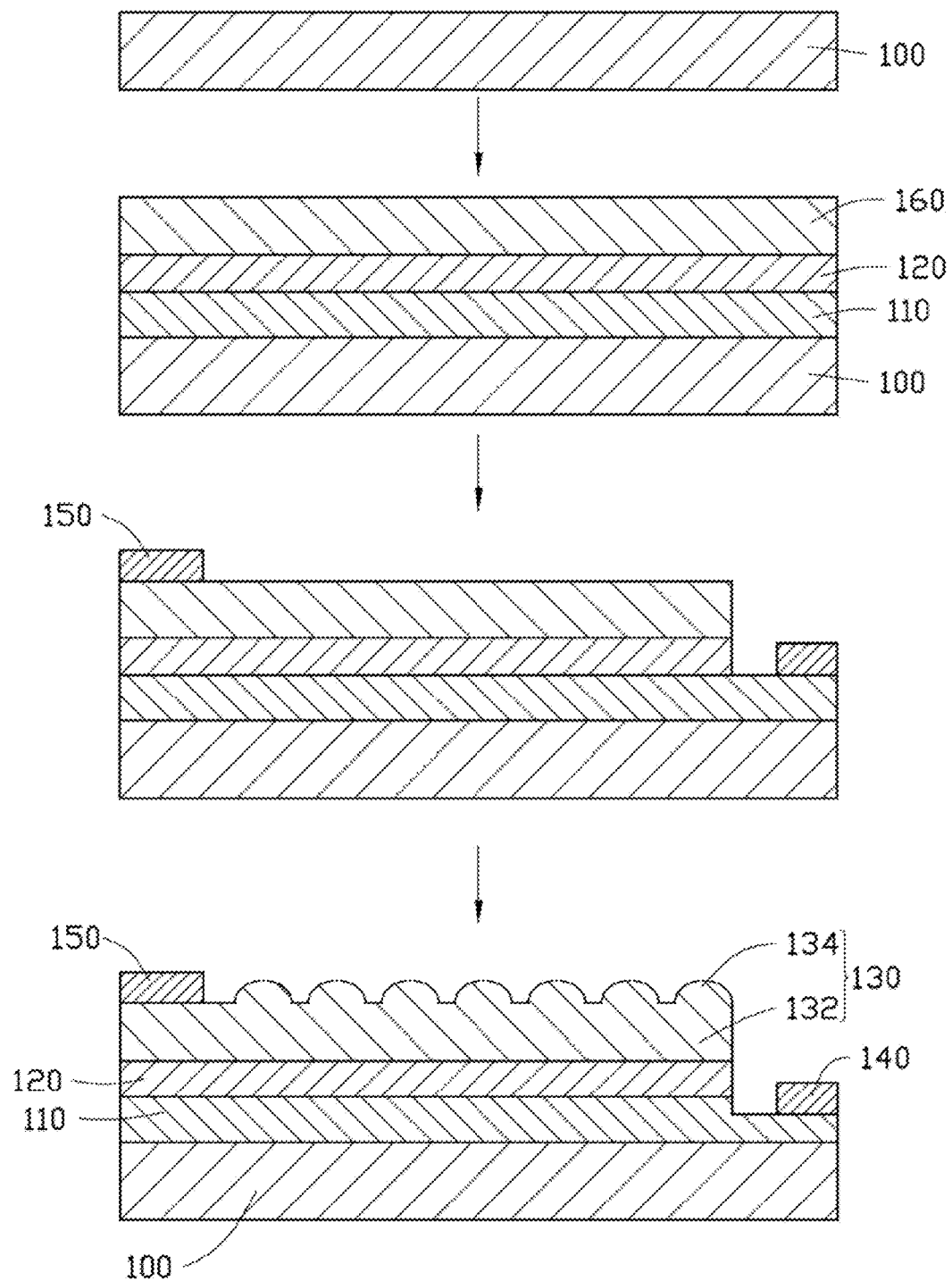
FIG. 6 shows a flowchart of one embodiment of a method for forming a light emitting diode.
Figure 7:
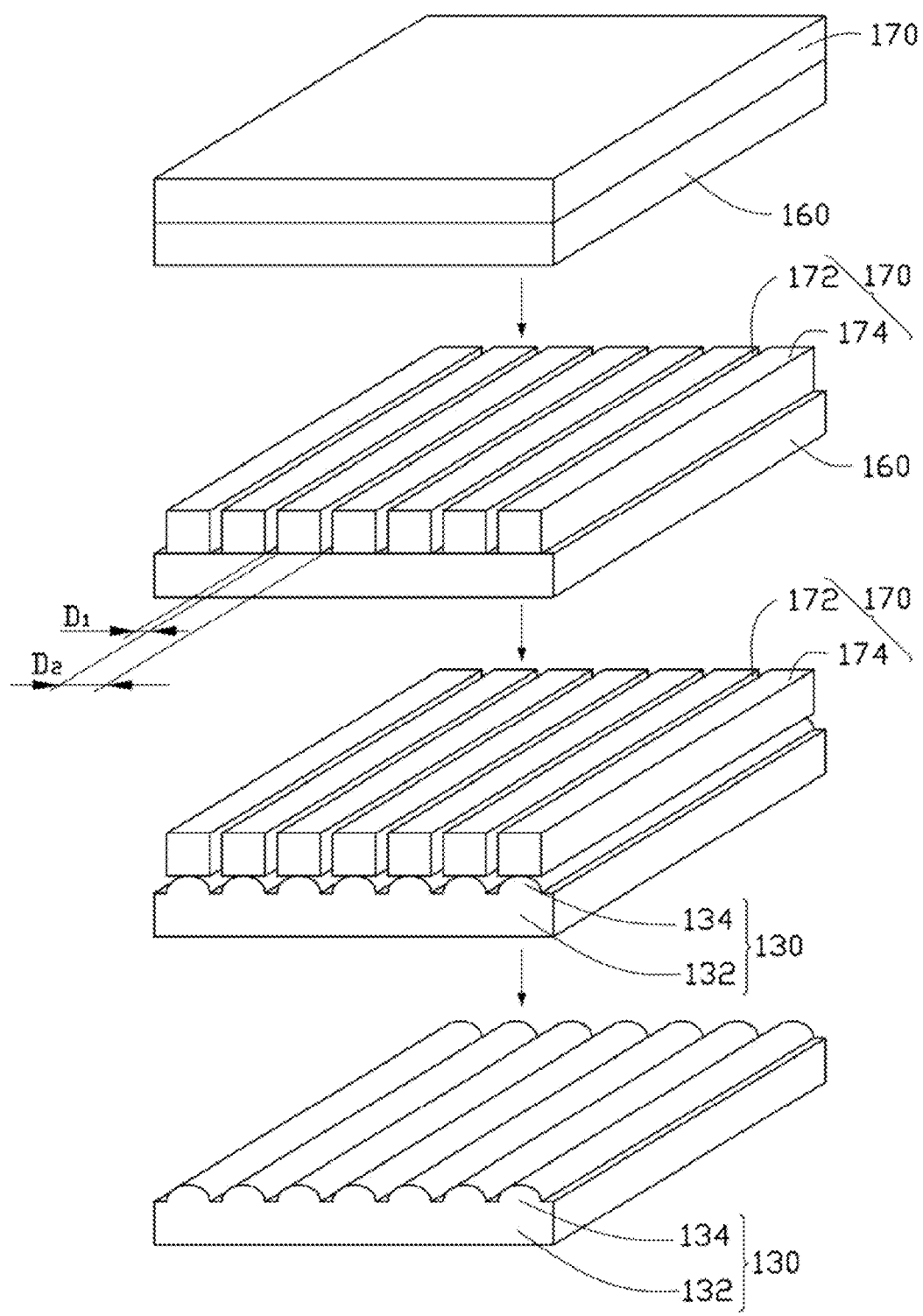
FIG. 7 shows a process of one embodiment of a method for forming a number of first three-dimensional nano-structures on a second semiconductor pre-layer.

Referring to FIGS. 6 and 7, one embodiment of a method for making the LED 10 comprises the following steps:

(S11), providing a substrate 100 with an epitaxial growth surface;

(S12), forming a first semiconductor layer 110, an active layer 120 and a second semiconductor pre-layer 160 on the epitaxial growth surface in that order;

(S13), electrically connecting a first electrode 140 to the first semiconductor layer 110;

(S14), electrically connecting a second electrode 150 to the second semiconductor pre-layer 160; and (S15), applying a patterned mask layer 170 on the second semiconductor pre-layer 160, forming a number of first three-dimensional nano-structures 134 on a surface of the second semiconductor pre-layer 160 away from the active layer 120, and removing the patterned mask layer 170.

In step (S11), a material of the substrate 100 can be selected according to a material of the first semiconductor layer 110. The first semiconductor layer 110 and the substrate 100 should have a small crystal lattice mismatch and a thermal expansion mismatch. The size, thickness, and shape of the substrate 100 can be selected according to need. In one embodiment, the substrate 100 is a sapphire substrate.

In step (S12), the first semiconductor layer 110 can be grown via a process of molecular beam epitaxy, chemical beam epitaxy, vacuum epitaxy, low temperature epitaxy, selective epitaxial growth, liquid phase deposition epitaxy, metal organic vapor phase epitaxy, ultra-high vacuum chemical vapor deposition, hydride vapor phase epitaxy, or metal organic chemical vapor deposition.

In one embodiment, a material of the first semiconductor layer 110 is Si-doped N-type GaN. The first semiconductor layer 110 is made by a MOCVD method, and a growth of the first semiconductor layer 110 is a heteroepitaxial growth. In the MOCVD method, a nitrogen source gas is high-purity ammonia, the carrier gas is hydrogen, the Ga source gas is trimethyl gallium or triethyl gallium, and the Si source gas is silane. The growth of the first semiconductor layer 110 comprises the following steps:

(a1), placing the substrate 100 into a reaction chamber and heating the substrate 100 to about 1100° C. to about 1200° C., introducing the carrier gas, and baking the substrate 100 for about 200 seconds to about 1000 seconds;

(a2), growing the low-temperature GaN layer by reducing the temperature of the substrate 100 to a range from about 500° C. to 650° C. in the carrier gas atmosphere, and introducing the Ga source gas and the nitrogen source gas at the same time;

(a3), stopping the flow of the Ga source gas in the carrier gas and nitrogen source gas atmosphere, increasing the temperature of the substrate 100 to a range from about 1100° C. to about 1200° C., and maintaining the temperature for about 30 seconds to about 300 seconds; and (a4), growing the high quality first semiconductor layer 110 by maintaining the temperature of the substrate 100 in a range from about 1000° C. to about 1100° C., and reintroducing the Ga source gas again and the Si source gas.

In step (a2), the low-temperature GaN can be used as a buffer layer (not shown) to grow the first semiconductor layer 110. A thickness of the buffer layer can be less than the thickness of the first carbon nanotube layer. Because the first semiconductor layer 110 and the substrate 100 have different lattice constants, the buffer layer can be used to reduce the lattice mismatch during the growth process, thus the dislocation density of the first semiconductor layer 110 will be decreased.

The growth method of the active layer 120 is similar to the growth method of the first semiconductor layer 110. In one embodiment, the indium source gas is trimethyl indium. The method for growing the active layer 120 comprises the following steps:

(b1) introducing the hydrogen, nitrogen, and Ga source gas and maintaining the temperature of the reaction chamber at a temperature ranged from about 700° C. to about 900° C., and the pressure of the reaction chamber range from about 50 torrs to about 500 torrs; and (b2) introducing the trimethyl gallium and growing InGaN/GaN multilayer quantum well film to form the active layer 120.

The second semiconductor pre-layer 160 is grown after the growth of the active layer 120. In one embodiment, the Mg source gas is ferrocene magnesium ($Cp_2Mg$), and the method comprises the following steps:

(c1) stopping the flow of the trimethyl gallium and maintaining the temperature of the reaction chamber in a range from about 1000° C. to about 1100° C., and maintaining the pressure of the reaction chamber at a pressure a ranged from about 76 torrs to about 200 torrs; and (c2) introducing the ferrocene magnesium and growing P-type gallium nitride doped with Mg to form the second semiconductor pre-layer 160.

In step (S13), the first electrode 140 can be formed by the following steps:

S131, exposing a portion of the surface of the first semiconductor layer 110 by etching the second semiconductor pre-layer 160 and the active layer 120; and S132, locating the first electrode 140 on the exposed portion of the first semiconductor layer 110.

In step (S131), the second semiconductor layer 130 and the active layer 120 can be etched via light etching, electronic etching, plasma etching, or chemical corrosion method. The exposed portion of the surface of the first semiconductor layer 110 can be the second region of the first semiconductor layer 110.

In step (S132), the first electrode 140 can be formed via a process of physical vapor deposition, such as electron beam evaporation, vacuum evaporation, ion sputtering, or any physical deposition. Furthermore, the first electrode 140 can also be formed by directly attaching a conductive sheet on the exposed portion of the first semiconductor layer 110. The first electrode 140 can be located on the second region and spaced from the active layer 120 and the second semiconductor layer 130.

In step (S14), the method for making the second electrode 150 is the same as that of the first electrode 140. The second electrode 150 can be located on the surface of the second semiconductor pre-layer 160, away from the active layer 120. The second electrode 150 can be a continuous layered-structure and cover a part of the surface of the second semiconductor layer 130.

Referring to FIG. 7, in step (S15), the method for forming the first three-dimensional nano-structures 134 on the surface of the second semiconductor pre-layer 160 away from the active layer 120 can comprise the steps of:

(S151), forming a mask layer 170 on the surface of the second semiconductor pre-layer 160 away from the active layer 120;

(S152), patterning the mask layer 170 by nanoimprinting method or etching method;

(S153), etching the surface of the second semiconductor pre-layer 160 to form the first three-dimensional nano-structures 134; and (S154), removing the mask layer 170.

In step (S151), a material of the mask layer 170 can be ZEP520A, hydrogen silsesquioxane, polymethylmethacrylate, polystyrene, silicon on glass, or other silitriangle oligomers. The mask layer 170 can be used to protect the second semiconductor pre-layer 160, the first electrode 140, and second electrode 150 with the mask layer 170 thereon. In one embodiment, the material of the mask layer 170 is ZEP520A.

The mask layer 170 can be formed on the surface of the second semiconductor pre-layer 160, the first electrode 140 and second electrode 150 by spin coating method, slit coating method, slit and spin coating method, or dry film lamination method. In one embodiment, the mask layer 170 is formed by the following steps. First, the surface of the second semiconductor pre-layer 160 is cleaned. Second, a layer of ZEP520A is coated on the second semiconductor pre-layer 160, the first electrode 140 and second electrode 150 by spin coating at a speed of about 500 rounds per minute to about 6000 rounds per minute, for about 0.5 minutes to about 1.5 minutes. Third, the layer of ZEP520A is dried at a temperature of about 140 degrees centigrade to 180 degrees centigrade, for about 3 minutes to about 5 minutes, thereby the mask layer 170 on the second semiconductor pre-layer 160, the first electrode 140 and second electrode 150 is formed. A thickness of the mask layer 170 can be in a range of about 100 nm to about 500 nm.

In step (S152), the mask layer 170 can be patterned by electron beam lithography method, photolithography method, or nanoimprint lithography method. In one embodiment, the mask layer 170 is patterned by electron beam lithography. During the patterning process, a number of grooves 172 can be formed in the mask layer 170 to expose the surface of the second semiconductor pre-layer 160. The grooves 172 can be uniformly distributed in the mask layer 170 and spaced from each other. The mask layer 170, between each adjacent two grooves 172, forms a linear wall 174.

A distribution of the linear walls 174 can be almost the same as a distribution of the first three-dimensional nano-structures 134. The linear walls 174 can be uniformly distributed in the mask layer 170 to form an array. The linear walls 174 in the array can be substantially equidistantly arranged, concentric circularly arranged, or concentric rectangularly arranged. The linear wall 174 can arrange along a straight line, a curvy line, or a polygonal line. A width of the linear walls 174 can be equal to the width $D_2$ of the linear protruding structures. The width of the linear walls 174 can range from about 200 nm to about 1000 nm. In some embodiments, the width of the linear walls 174 ranges from about 300 nm to about 400 nm. A distance between adjacent linear walls 174 can be equal to the distance $D_1$ between adjacent linear protruding structures 114. The distance between adjacent linear walls 174 can range from about 10 nm to about 1000 nm. In some embodiments, the distance between adjacent linear walls 174 ranges from about 100 nm to about 200 nm. In one embodiment, the linear walls 174 are substantially equidistantly arranged and extend along a same direction; the distance between adjacent linear walls 174 is about 140 nm; and the width of the linear walls 174 is about 320 nm.

In step (S153), the process of etching the surface of the second semiconductor pre-layer 160 can be carried out in a microwave plasma system at Reaction-Ion-Etching Mode. The microwave plasma system can produce a reactive atmosphere 180. A material of the reactive atmosphere 180 can be chosen according to the material of the second semiconductor pre-layer 160 and the material of the mask layer 170. The reactive atmosphere 180 with lower ions energy can diffuse to the surface of the second semiconductor pre-layer 160 between adjacent linear walls 174, to etch the surface of the second semiconductor pre-layer 160.

Figure 8:
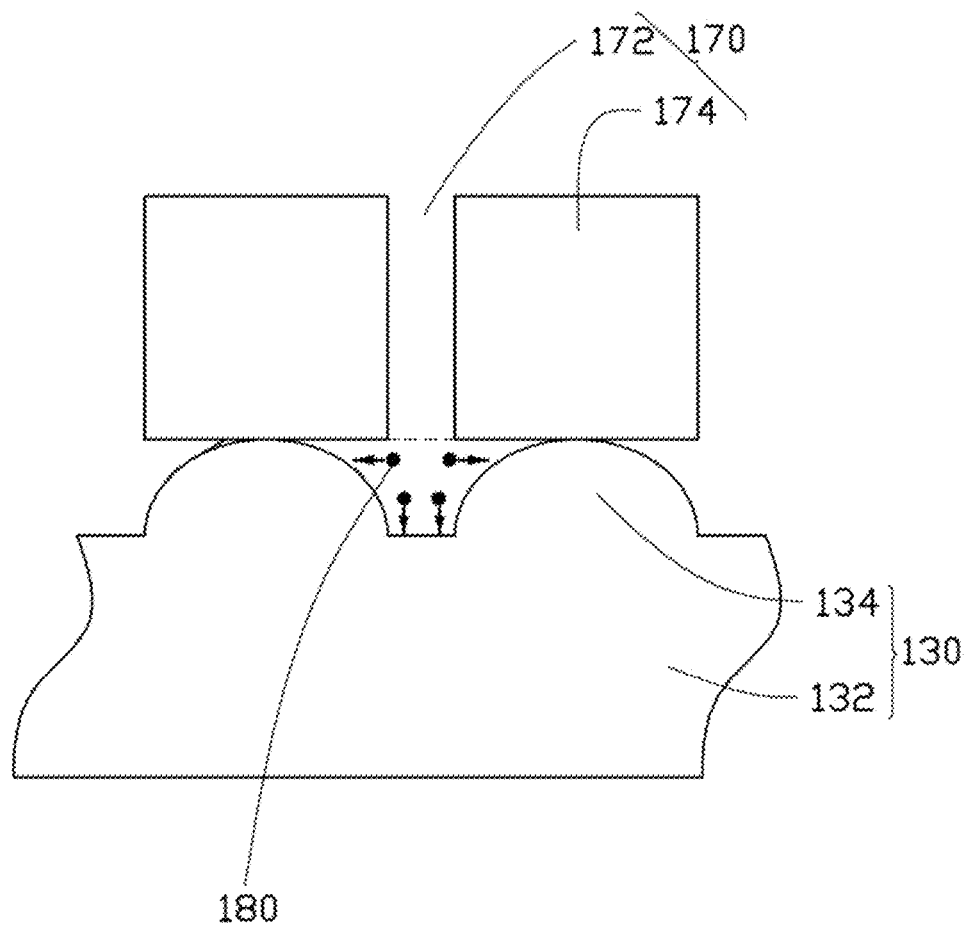
FIG. 8 shows a process of one embodiment of a method for etching a second semiconductor pre-layer.

Referring to FIG. 8, the reactive atmosphere 180 can etch the second semiconductor pre-layer 160 exposed by the grooves 172 along a first etch direction. The first etch direction is substantially perpendicular to the surface of the second semiconductor pre-layer 160. At the same time, two sidewalls of the second semiconductor pre-layer 160 covered by the linear walls 174 can be formed gradually as the second semiconductor pre-layer 160 is etched along the first etch direction. Thus, the reactive atmosphere 180 can etch the two sidewalls of the second semiconductor pre-layer 160 covered by the linear walls 174 along a second etch direction. The second etch direction can be substantially paralleled to the surface of the second semiconductor pre-layer 160. Therefore, the first three-dimensional nano-structures 134 can be formed.

In one embodiment, the reactive atmosphere 180 consists of chlorine gas and argon gas. An input flow rate of the chlorine gas can be lower than an input flow rate of the argon gas. The input flow rate of the chlorine gas can be in a range from about 4 standard-state cubic centimeters per minute to about 20 standard-state cubic centimeters per minute. The input flow rate of the argon gas can be in a range from about 10 standard-state cubic centimeters per minute to about 60 standard-state cubic centimeters per minute. A power of the plasma system can be in a range from about 40 Watts to about 70 Watts. A working pressure of the reactive atmosphere 180 can be a range from about 2 Pa to about 10 Pa. An etching time of the reactive atmosphere 180 can be in a range from about 1 minute to about 2.5 minutes. In one embodiment, the input flow rate of the chlorine gas is about 10 standard-state cubic centimeters per minute; the input flow rate of the argon gas is about 25 standard-state cubic centimeters per minute; the power of the plasma system is about 70 Watts; the working pressure of the reactive atmosphere 180 is about 2 Pa; and the etching time of the reactive atmosphere 180 is about 2 minutes.

In step (S154), the first three-dimensional nano-structures 134 can be obtained by dissolving the mask layer 170. The mask layer 170 can be removed by dissolving it in a stripping agent such as tetrahydrofuran, acetone, butanone, cyclohexane, hexane, methanol, or ethanol. In one embodiment, the stripping agent is acetone and the mask layer 170 is dissolved in acetone and separated from the second semiconductor pre-layer 160. The mask layer 170 is removed to form the second semiconductor layer 130.

In some embodiments, the step of forming the first three-dimensional nano-structures 134 on the surface of the second semiconductor pre-layer 160 can be carried out before the step of forming the first electrode 140 and second electrode 150.

The method for making the LED 10 has the following advantages. First, by controlling the input flow rates of the chlorine gas and the argon gas, the reactive atmosphere can etch the semiconductor pre-layer along two different etch directions, thus, the first three-dimensional nano-structures can be easily formed on the surface of the semiconductor pre-layer. Second, the method can be carried out at room temperature, thus, the method is simple and low cost.

Figure 9:
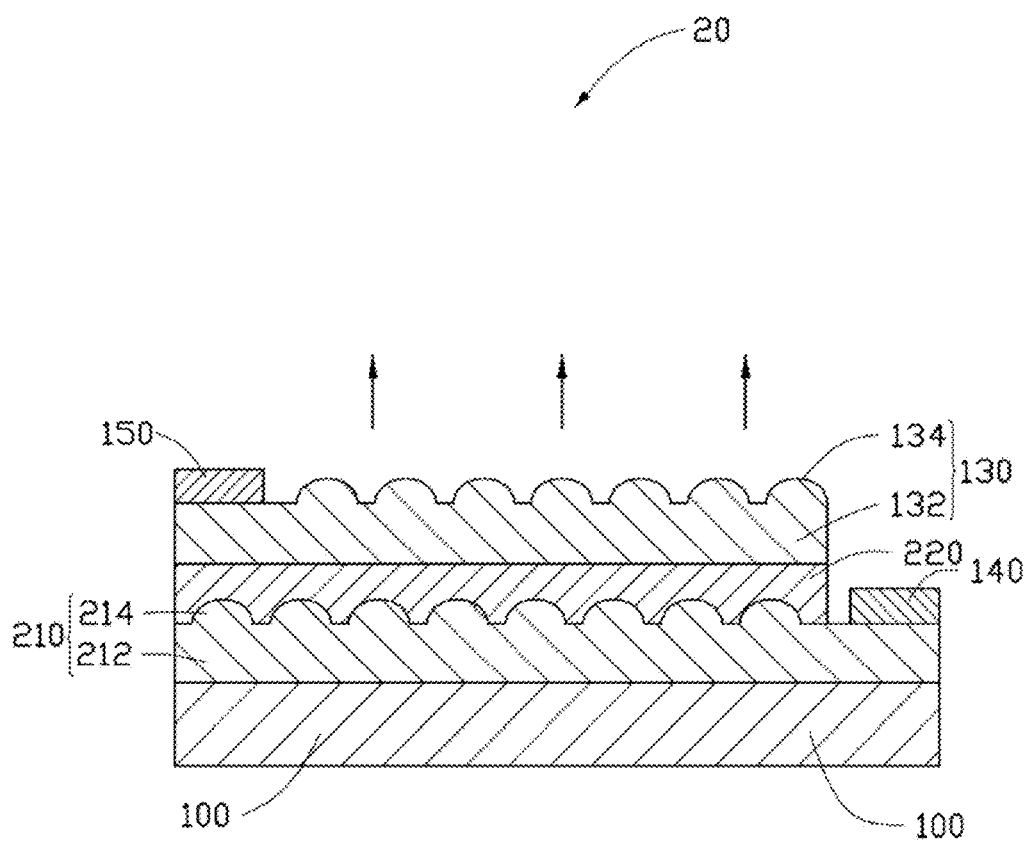
FIG. 9 is a schematic view of another embodiment of a light emitting diode.

Referring to FIG. 9, another embodiment of an LED 20 is provided. The LED 20 comprises a substrate 100, a first semiconductor layer 210, an active layer 220, a second semiconductor layer 130, a first electrode 140, and a second electrode 150.

The structure of the LED 20 is basically the same as the structure of the LED 10, except that the first semiconductor layer 210 comprises a body 212 and a number of the second three-dimensional structures 214 located on a surface of the body 212 away from the substrate 100. The second three-dimensional structures 214 can be protruding structures. The protruding structures can protrude out of the surface of the body 212 to form an integrated structure. The second three-dimensional structures 214 can be linear protruding structures, dotted protruding structures, or a combination of linear protruding structures and dotted protruding structures. A cross-section of the linear protruding structure can be triangle, square, rectangular, trapezoidal, arc, semicircle, or other shapes. A shape of the dotted protruding structures can be sphere, ellipsoid, single layer of truncated pyramid, multi-layer of truncated pyramid, single layer of prism, multi-layer of prism, single layer of frustum, multi-layer of frustum or other shapes. In one embodiment, the structures of the second three-dimensional structures 214 are the same as the structure of the first three-dimensional nano-structures 134. That is, a cross-section of each second three-dimensional structure 214 is a semicircle having a diameter of about 320 nm and a distance between adjacent second three-dimensional structures 214 is about 140 nm.

The active layer 220 comprises a number of third three-dimensional structures (not labeled) corresponding to the second three-dimensional structures 214. The third three-dimensional structures can be hollow structures recessed from the surface of the active layer 220 and can correspond to the second three-dimensional structures 214. Thus, the active layer 220 and the first semiconductor layer 210 can be combined without interval. Therefore, a contact surface between the active layer 220 and the first semiconductor layer 210 can be increased, and the electron-hole recombination density can be improved.

The LED 20 can further comprise a number of fourth three-dimensional structures (not labeled) located on the surface of the active layer 220 away from the first semiconductor layer 210. A structure of the fourth three-dimensional structures can be the same as the structure of the second three-dimensional structures 214. Thus, a contact surface between the active layer 220 and the second semiconductor layer 130 can be increased, and the electron-hole recombination density can be further improved.

In the LED 20, the surface of the active layer in contact with the first semiconductor layer comprises a number of second three-dimensional nano-structures 214. Thus, the contact area between them can be enlarged. Therefore, the electron-hole recombination density can be further increased and the light extraction efficiency of the LED 20 can be improved.

Figure 10:
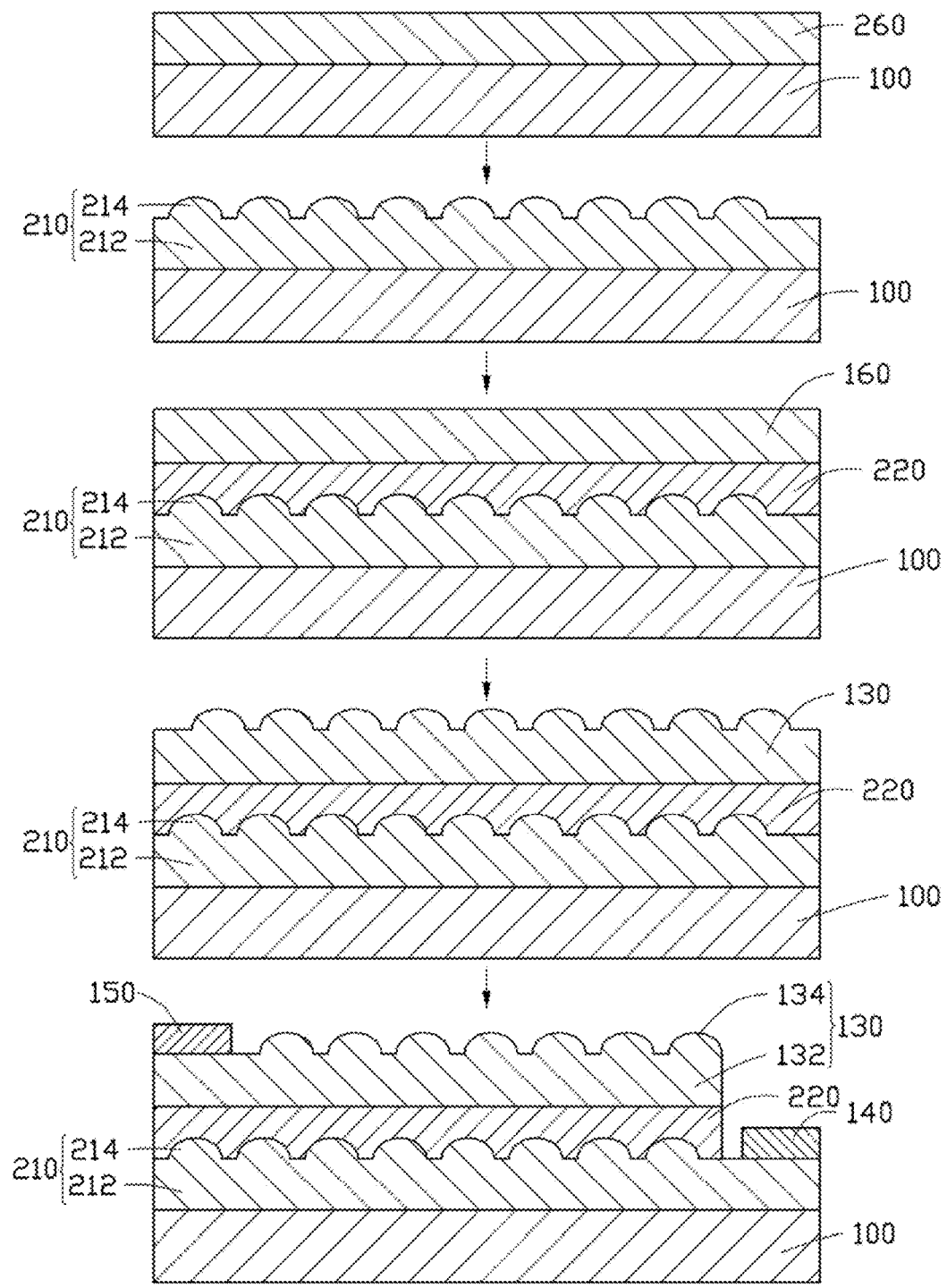
FIG. 10 shows a flowchart of another embodiment of a method for forming a light emitting diode.

Referring to FIG. 10, one embodiment of a method for making the LED 20 comprises the following steps:

(S21), providing a substrate 100 with an epitaxial growth surface;

(S22), applying a first semiconductor pre-layer 260 on the epitaxial growth surface;

(S23), forming a number of second three-dimensional nano-structures 214 on a surface of the first semiconductor pre-layer 260 away from the substrate 100, thus forming a first semiconductor layer 210;

(S24), applying an active layer 220 and a second semiconductor pre-layer 160 on the first semiconductor layer 210 in that order;

(S25), forming a number of first three-dimensional nano-structures 134 on a surface of the second semiconductor pre-layer 160 away from the active layer 220, thus, forming the second semiconductor layer 130;

(S26), applying a first electrode 140 that is electrically connected to the first semiconductor layer 210; and (S27), applying a second electrode 150 that is electrically connected to the second semiconductor layer 130.

The method for forming the LED 20 is substantially similar to the method of the LED 10 described above, except that after the first semiconductor pre-layer 260 is formed, a step of forming the second three-dimensional nano-structures 214 on the surface of the first semiconductor pre-layer 260 away from the substrate 100 is further provided. The method for making the second three-dimensional nano-structures 214 can be the same with or different from that of the first three-dimensional nano-structures 134. In one embodiment, the structures of the second three-dimensional nano-structures 214 are the same with the structures of the first three-dimensional nano-structures 134, thus, the method for making the second three-dimensional nano-structures 214 is the same with the method of the first three-dimensional nano-structures 134.

In step S24, the method for making the active layer 220 is substantially similar to that of the active layer 220 described above, except that the active layer 220 is grown via a horizontal epitaxial growth method. Specifically, the substrate 100 with the first semiconductor layer 210 thereon can be located into a horizontal epitaxial growth reactor. A growth direction of the active layer 220 can be controlled by a horizontal growth speed and a vertical growth speed. Thus, the surface of the active layer 220 away from the first semiconductor layer 110 can be planar.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A light emitting diode, comprising:
  a substrate comprising a first surface;
  a first semiconductor layer, an active layer, and a second semiconductor layer, stacked in that order, located on the first surface;
  a first electrode electrically connected with the first semiconductor layer; and
  a second electrode electrically connected with the second semiconductor layer;
  wherein the second semiconductor layer comprises a body and a plurality of three-dimensional nano-structures located on a body surface away from the active layer; the plurality of three-dimensional nano-structures are linear protruding structures that are spaced from each other; a cross-section of each linear protruding structure is a semicircle; a diameter of each semicircle is 320 nm; and a distance between adjacent three-dimensional nano-structures is 140 nm; wherein the plurality of three-dimensional nano-structures are substantially parallel with each other and extend along the body surface, and each of the plurality of three-dimensional nano-structures extends from a first side of the body surface to a second side opposite to the first side and has a length equal to a width of the body surface from the first side to the second side; and each of the first electrode and the second electrode is a carbon nanotube film, wherein a light extraction intensity of the light emitting diode is about 500 A.U. at a wavelength of about 530 nm.

2. The light emitting diode of claim 1, wherein the body and the plurality of three-dimensional nano-structures are an integrated structure.

3. The light emitting diode of claim 1, wherein the plurality of three-dimensional nano-structures is substantially equidistantly arranged and arranged along a same direction.

4. The light emitting diode of claim 1, wherein the plurality of three-dimensional nano-structures are concentric circularly arranged, or concentric rectangle arranged.

* * * * *